United States Patent
Bhatia et al.

(10) Patent No.: US 11,146,289 B2
(45) Date of Patent: Oct. 12, 2021

(54) TECHNIQUES TO USE INTRINSIC INFORMATION FOR A BIT-FLIPPING ERROR CORRECTION CONTROL DECODER

(71) Applicant: Intel Corporation, Santa Clara, CA (US)

(72) Inventors: Aman Bhatia, Los Gatos, CA (US); Zion S. Kwok, Burnaby (CA); Justin Kang, Vancouver (CA); Poovaiah M. Palangappa, San Jose, CA (US); Santhosh K. Vanaparthy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 16/370,178

(22) Filed: Mar. 29, 2019

(65) Prior Publication Data

US 2019/0238158 A1    Aug. 1, 2019

(51) Int. Cl.
| H03M 13/11 | (2006.01) |
| G11C 29/52 | (2006.01) |
| G06F 11/10 | (2006.01) |
| G11C 29/04 | (2006.01) |

(52) U.S. Cl.
CPC ..... *H03M 13/1108* (2013.01); *G06F 11/1012* (2013.01); *G06F 11/1068* (2013.01); *G11C 29/52* (2013.01); *G11C 2029/0411* (2013.01)

(58) Field of Classification Search
CPC ............ H03M 13/1108; G06F 11/1012; G06F 11/1068; G11C 29/52; G11C 2029/0411

USPC ........................................................ 714/764
See application file for complete search history.

(56) References Cited

U.S. PATENT DOCUMENTS

| 5,636,231 A | 6/1997 | Huang et al. |
| 9,250,990 B2 | 2/2016 | Motwani et al. |
| 2004/0218440 A1 | 11/2004 | Kumar et al. |
| 2011/0138253 A1 | 6/2011 | Gunnam |
| 2012/0185744 A1* | 7/2012 | Varnica ............... H03M 13/1131 714/752 |
| 2014/0068379 A1* | 3/2014 | Sakaue ............... G06F 11/1012 714/764 |
| 2014/0281786 A1* | 9/2014 | Ueng ................... H03M 13/114 714/752 |

(Continued)

OTHER PUBLICATIONS

Ercan, F., et al., "Improved Bit-Flipping Algorithm for Successive Cancellation Decoding of Polar Codes", arXiv:1808.03616v2 [cs.IT], Sep. 26, 2018, 12 pp.

(Continued)

*Primary Examiner* — Albert Decady
*Assistant Examiner* — Enam Ahmed
(74) *Attorney, Agent, or Firm* — Compass IP Law PC

(57) ABSTRACT

Examples include techniques to use intrinsic information when implementing a bit-flipping algorithm. An error correction control (ECC) decoder uses the intrinsic information to decode a low density parity count (LDPC) codeword. The intrinsic information including bits of a copy of a received LDPC codeword are compared to bits for variable nodes during an iteration of the bit-flipping algorithm to aid a determination as whether one or more bits for the variable nodes are to be flipped.

20 Claims, 11 Drawing Sheets

(56) References Cited

U.S. PATENT DOCUMENTS

| | | | | |
|---|---|---|---|---|
| 2016/0006495 A1* | 1/2016 | Kim | ...................... | H04B 7/0417 |
| | | | | 370/329 |
| 2017/0207799 A1* | 7/2017 | Vazhenin | .............. | H04L 1/0057 |
| 2018/0123614 A1* | 5/2018 | Loncke | .............. | H03M 13/1125 |
| 2019/0146871 A1* | 5/2019 | Jeong | .................. | G06F 12/1009 |
| | | | | 714/764 |
| 2020/0373944 A1* | 11/2020 | Cho | ........................ | G06F 3/064 |

OTHER PUBLICATIONS

Huang, Q., et al., "Cyclic and Quasi-Cyclic LDPC Codes on Row and Column Constrained Parity-Check Matrices and Their Trapping Sets", arXiv:1012.3201v1 [cs.IT], Submitted to IEEE Transactions on Information Theory, Dec. 15, 2010, 71 pp.

Ishikawa, T., et al., "High-Throughput Decoder for Low-Density Parity-Check Code", In Proceedings of the Asia and South Pacific Conference on Design Automation, Jan. 2006, 2 pp.

Office Action for U.S. Appl. No. 16/422,891, dated Nov. 18, 2020, 15 pages.

Zhong, H., et al., "Quasi-Cyclic LDPC Codes for the Magnetic Recording Channel: Code Design and VLSI Implementation", IEEE Transactions on Magnetics, vol. 43, No. 3, Mar. 2007, 6 pp.

Zhou, X., et al., "Improved Iterative Bit Flipping Decoding Algorithms for LDPC Convolutional Codes", In Proceedings of the 2007 IEEE Pacific Rim Conference on Communications, Computers and Signal Processing, Aug. 2007, 4 pp.

\* cited by examiner

900

```
┌─────────────────────────────────────────────────────────┐
│              RECEIVE AN LDPC CODEWORD                    │
│                         902                              │
└─────────────────────────────────────────────────────────┘
                            │
┌─────────────────────────────────────────────────────────┐
│   STORE BITS OF THE LDPC CODEWORD IN A FIRST BUFFER OF A BIT- │
│  FLIPPING ECC DECODER FOR USE OF EACH BIT OF THE LDPC CODEWORD│
│    AS A SEPARATE VARIABLE NODE BY THE BIT-FLIPPING ECC DECODER│
│                         904                              │
└─────────────────────────────────────────────────────────┘
                            │
┌─────────────────────────────────────────────────────────┐
│  STORE INFORMATION THAT INCLUDES THE BITS OF THE LDPC CODEWORD│
│      IN A SECOND BUFFER OF THE BIT-FLIPPING ECC DECODER  │
│                         906                              │
└─────────────────────────────────────────────────────────┘
                            │
┌─────────────────────────────────────────────────────────┐
│   DETERMINE WHETHER ONE OR MORE CHECK NODES COUPLED WITH THE │
│    SEPARATE VARIABLE NODES ARE UNSATISFIED BASED ON SEPARATE │
│     PARITY CHECK EQUATIONS FOR THE ONE OR MORE CHECK NODES   │
│    CALCULATED DURING AN ITERATION OF A BIT-FLIPPING ALGORITHM│
│                         908                              │
└─────────────────────────────────────────────────────────┘
                            │
┌─────────────────────────────────────────────────────────┐
│    COMPARE THE BITS OF THE LDPC CODEWORD STORED IN THE SECOND│
│        BUFFER TO BITS FOR THE SEPARATE VARIABLE NODES    │
│                         910                              │
└─────────────────────────────────────────────────────────┘
                            │
┌─────────────────────────────────────────────────────────┐
│    ADJUST A VALUE ASSOCIATED WITH ONE OR MORE CRITERIA FOR   │
│     FLIPPING A BIT INCLUDED IN INDIVIDUAL BITS OF THE SEPARATE│
│  VARIABLE NODES BASED ON WHETHER THE BIT MATCHES A RESPECTIVE│
│    BINARY VALUE FOR A CORRESPONDING BIT OF THE LDPC CODEWORD │
│                   STORED IN THE SECOND BUFFER;           │
│         CAUSING THE BIT TO FLIP BASED ON THE ADJUSTED VALUE  │
│                         912                              │
└─────────────────────────────────────────────────────────┘
                            │
┌─────────────────────────────────────────────────────────┐
│         CAUSE THE BIT TO FLIP BASED ON THE ADJUSTED VALUE    │
│                         916                              │
└─────────────────────────────────────────────────────────┘
                            │
┌─────────────────────────────────────────────────────────┐
│   DECODE THE LDPC CODEWORD WITH THE FLIPPED BIT BASED ON ALL │
│   CHECK NODES COUPLED WITH THE SEPARATE VARIABLE NODES BEING │
│          SATISFIED FOLLOWING THE FLIPPING OF THE BIT     │
│                         918                              │
└─────────────────────────────────────────────────────────┘
```

FIG. 9

Storage Medium 1000

*Computer Executable Instructions for 900*

*FIG. 10*

TECHNIQUES TO USE INTRINSIC INFORMATION FOR A BIT-FLIPPING ERROR CORRECTION CONTROL DECODER

TECHNICAL FIELD

Examples described herein are generally related to techniques to improve a bit-flipping error correction control decoder using intrinsic information that may include bits of a codeword received from a medium such as a memory medium, a wireless communication medium or an optical communication medium.

BACKGROUND

An error correction code (ECC) may be used to protect data or recover from errors related to a medium via which the data was either transmitted or stored. For example, data may be encoded using an ECC to possibly recover from errors associated with wired/wireless communications, storage to memory devices/mediums or optical readers such as 2-dimensional bar code readers. ECC encoded data received by either reading data from a memory device/medium or barcode or received via a wired/wireless communication channel may be able to identify and correct a given number of errors. Typically, ECC encoded data may include codewords having a combination of data and redundant or parity bits or symbols. Depending on the size of a given codeword and the level of protection desired, codewords may vary in size and also may vary in the complexity of algorithms used to recover from possible errors.

Errors in a given period of time may be referred to as a residual bit error rate (RBER). Technological advances in digital signal transmissions that have greatly increased data transmission speeds have also increased the possibility of a higher RBER. Also, memory storage/medium technologies have resulted in increasingly denser storage that may also lead to an increased possibility of a higher RBER. In order to reduce the impacts of possibly higher RBERs, data may be encoded in larger codewords. These larger codewords may have more parity bits. Large codewords with more parity bits may require complex algorithms implemented with increasing amounts of computing resources.

BRIEF DESCRIPTION OF THE DRAWINGS

FIG. 9 illustrates an example of a third flow.
FIG. 10 illustrates an example of a storage medium.

DETAILED DESCRIPTION

As contemplated in the present disclosure, large codewords with more parity bits may require complex algorithms implemented with increasing amounts of computing resources in order to reduce RBERs. A type of codeword used to reduce RBERs associated with memory devices (e.g., a solid state drive) may be encoded using a low-density parity-check (LDPC) code. An LDPC code may provide relatively high levels of error-correction capabilities when used along with decoders arranged to implement algorithms such as a sum-product algorithm (SPA) or a min-sum algorithm (MSA). However, these MSA or SPA decoders may need a high level of circuitry (e.g., high gate counts) to maintain throughput requirements and this high level of circuitry may increase a circuitry footprint of these types of decoders to an unacceptable size and/or may also consume an unacceptably high amount of power.

A possible solution to the large, complex and power hungry MSA or SPA decoders is to use a less complex bit-flipping decoder to implement bit-flipping algorithms for error-correction encoded data using an LDPC code (hereinafter referred to as an "LDPC codeword"). A trade off may exist for this reduced complexity in that a bit-flipping decoder may significantly lower error-correction capabilities for an LDPC codeword compared to use of MSA or SPA ECC decoders. The lower error-correction capabilities of the bit-flipping ECC decoder may result in a scale down on RBER requirements in order to meet a queue depth requirement (e.g., 99% of LDPC codewords corrected). The scale down on RBER requirements may have negative impacts for a memory device storing data using LDPC codewords. The negative impacts may include reduced endurance for types of memory included in the memory device due to uncorrectable errors causing RBERs to exceed acceptable levels. Thus, a need exists for an improvement to the error-correction capabilities of a bit-flipping decoder for LDPC codewords.

Figure 1:
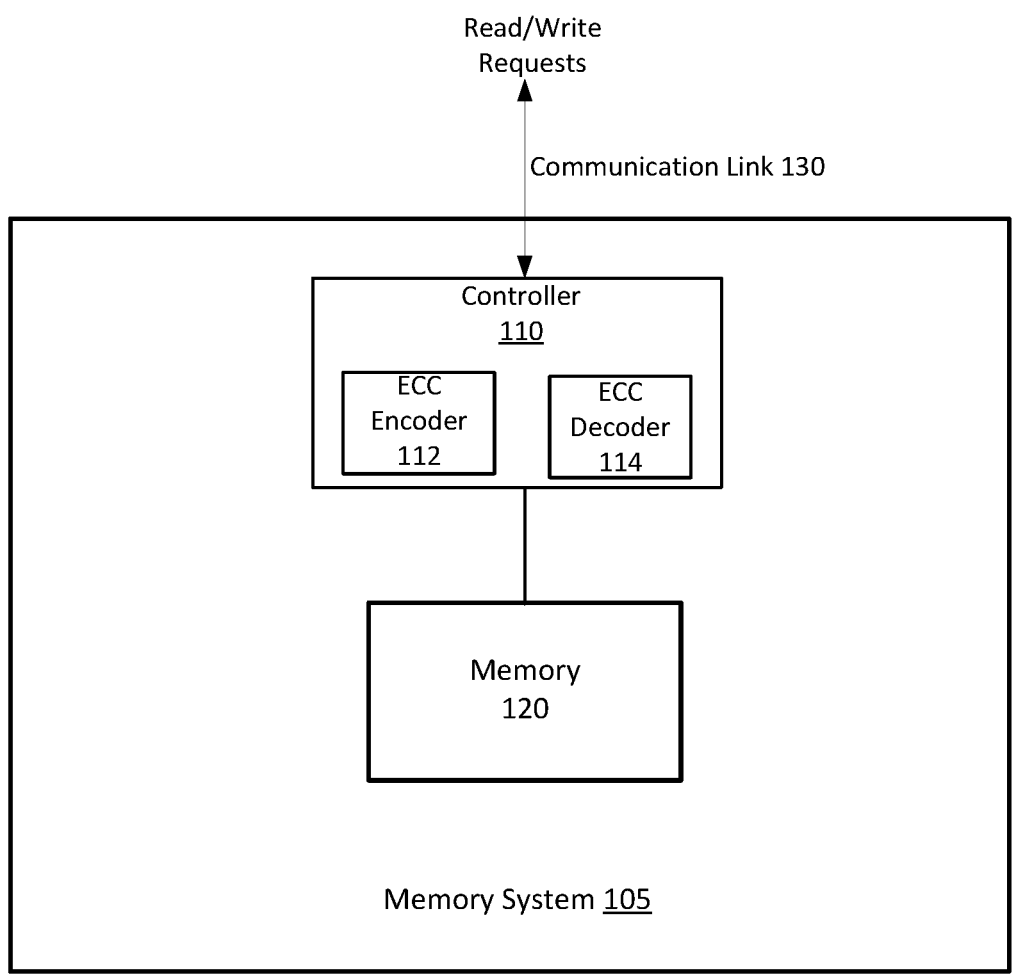
FIG. 1 illustrates an example first system.

FIG. 1 illustrates an example memory system 100. As shown in FIG. 1, system 100 includes a memory system 105 that includes a controller 110 and a memory 120. According to some examples, controller 110 may receive and/or fulfill read/write requests via communication link 130. Although not shown in FIG. 1, in some examples, communication link 130 may communicatively couple controller 110 to elements or features associated with an operating system for a computing device. For these examples, memory system 105 may be a memory device for the computing device. As a memory device, memory system 105 may serve as a two level memory (2LM) system or a solid state drive (SSD) for the computing device. As part of a 2LM system memory system 105 may serve as type of storage class or persistent memory device.

In some examples, as shown in FIG. 1, controller 110 may include an error correction code (ECC) encoder 112 and an ECC decoder 114. ECC encoder 112 may include logic and/or features to generate codewords to protect data to be written to memory 120. As described in more detail below, ECC decoder 114 may include logic and/or features to implement a bit-flipping algorithm that includes use of intrinsic information to correct errors included in ECC encoded data. According to some examples, the ECC used to encode the data may include, but is not limited to, an LDPC code and the ECC encoded data may be referred to as an LDPC codeword. Intrinsic information may include LDPC codeword bits received from a channel to access the LDPC codeword from, for example, a memory such as memory 120. Also, as described more below, the intrinsic information may be maintained in its original state while a working LDPC codeword is being error corrected using a bit-flipping algorithm.

In some examples, memory 120 may include non-volatile and/or volatile types of memory. Volatile types of memory may include, but are not limited to, random-access memory (RAM), Dynamic RAM (DRAM), double data rate synchronous dynamic RAM (DDR SDRAM), static random-access memory (SRAM), thyristor RAM (T-RAM) or zero-capacitor RAM (Z-RAM). Non-volatile types of memory may include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

In some examples, memory 120 may also include types of storage mediums such as optical discs to include, but not limited to, compact discs (CDs), digital versatile discs (DVDs), a high definition DVD (HD DVD) or a Blu-ray disc.

According to some examples where memory system 105 is configured as a 2LM system, memory system 100 may serve as main memory for a computing device. For these examples, memory 120 may include the two levels of memory including cached subsets of system disk level storage. In this configuration, the main memory may include "near memory" arranged to include volatile types of memory and "far memory" arranged to include volatile or non-volatile types of memory. The far memory may include volatile or non-volatile memory that may be larger and possibly slower than the volatile memory included in the near memory. The far memory may be presented as "main memory" to an operating system (OS) for the computing device while the near memory is a cache for the far memory that is transparent to the OS. The management of the 2LM system may be done by a combination of logic and modules executed via either controller 110 and/or processing circuitry (e.g., a CPU) for the computing device. Near memory may be coupled to the processing circuitry via high bandwidth, low latency means for efficient processing. Far memory may be coupled to the processing circuitry via relatively low bandwidth, high latency mean.

Figure 2:
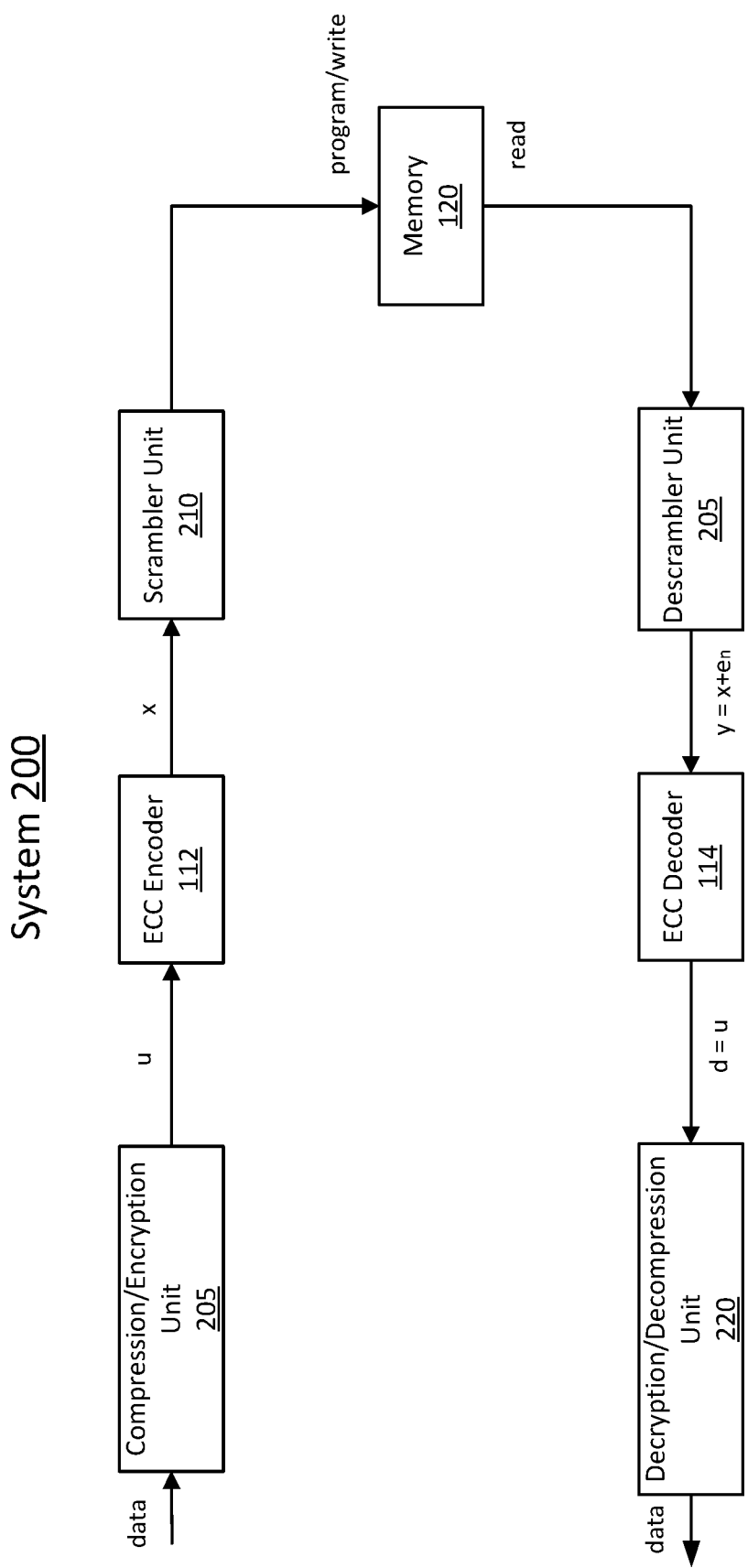
FIG. 2 illustrates an example second system

FIG. 2 illustrates an example system 200. In some examples, as shown in FIG. 2, system 200 includes a compression/encryption unit 205, ECC encoder 112, a scrambler unit 210, memory 120, a descrambler unit 205, ECC decoder 114 and a decryption/decompression unit 220.

According to some examples, as shown in FIG. 2, compression/encryption of data at compression/encryption unit 205 may result in "u". ECC encoder 112 may receive u and generate a codeword "x" using an ECC code (e.g., LDPC). Scrambler unit 210 may receive x and cause x to be programmed or written to memory 120. The codeword may be read from memory 120 and descrambled by descrambler unit 205 to result in a codeword "y". As shown in FIG. 2, y=x+en, where "en" represents errors possibly introduced during the writing then reading of x from memory 120 and "n" represents the number of errors introduced during the writes and reads from memory 120. ECC decoder 114 may receive y and possibly correct identified errors to generate "d". As shown in FIG. 2, if the errors were correctable, d=u. Decryption/Decompression unit 220 may then decrypt/decompress u to generate data originally compressed/encrypted by compression/encryption unit 205.

In some examples, ECC decoder 114 may include logic and/or features to receive ECC encoded data y having en. As described more below, ECC decoder 114 may implement a bit-flipping algorithm and use intrinsic information to determine which bits of an LDPC codeword are attributed to en. In some examples, ECC decoder 114 may include additional logic and/or features to further attempt to correct the LDPC codeword if the bit-flipping algorithm fails to decode the LDPC codeword. For example, via implementation of MSA or SPA algorithms.

Although FIG. 2, depicts ECC encoded data such as LDPC codewords having errors possibly caused by writing/reading data to memory 120. Other types of mediums using LDPC codewords such as, but not limited to, a wireless communications medium (e.g., radio wave), an optical communication medium (e.g., fiber optic) or a medium associated with an optical reader for a 2-dimentional bar code reader.

In some examples, a controller may include only an ECC encoder 112 (e.g., if the controller is a transmitting controller) or only an ECC decoder 114 (e.g., if the controller is a receiving controller). In examples where the type of medium using LDPC codewords is for a memory medium, ECC encoder 112 and ECC decoder 114 may be placed closest to the memory medium. For communication type mediums such as for wireless or optical communication mediums, a modulator may be between an ECC encoder and these mediums and a demodulator may be between an ECC decoder and these mediums.

Figure 3:
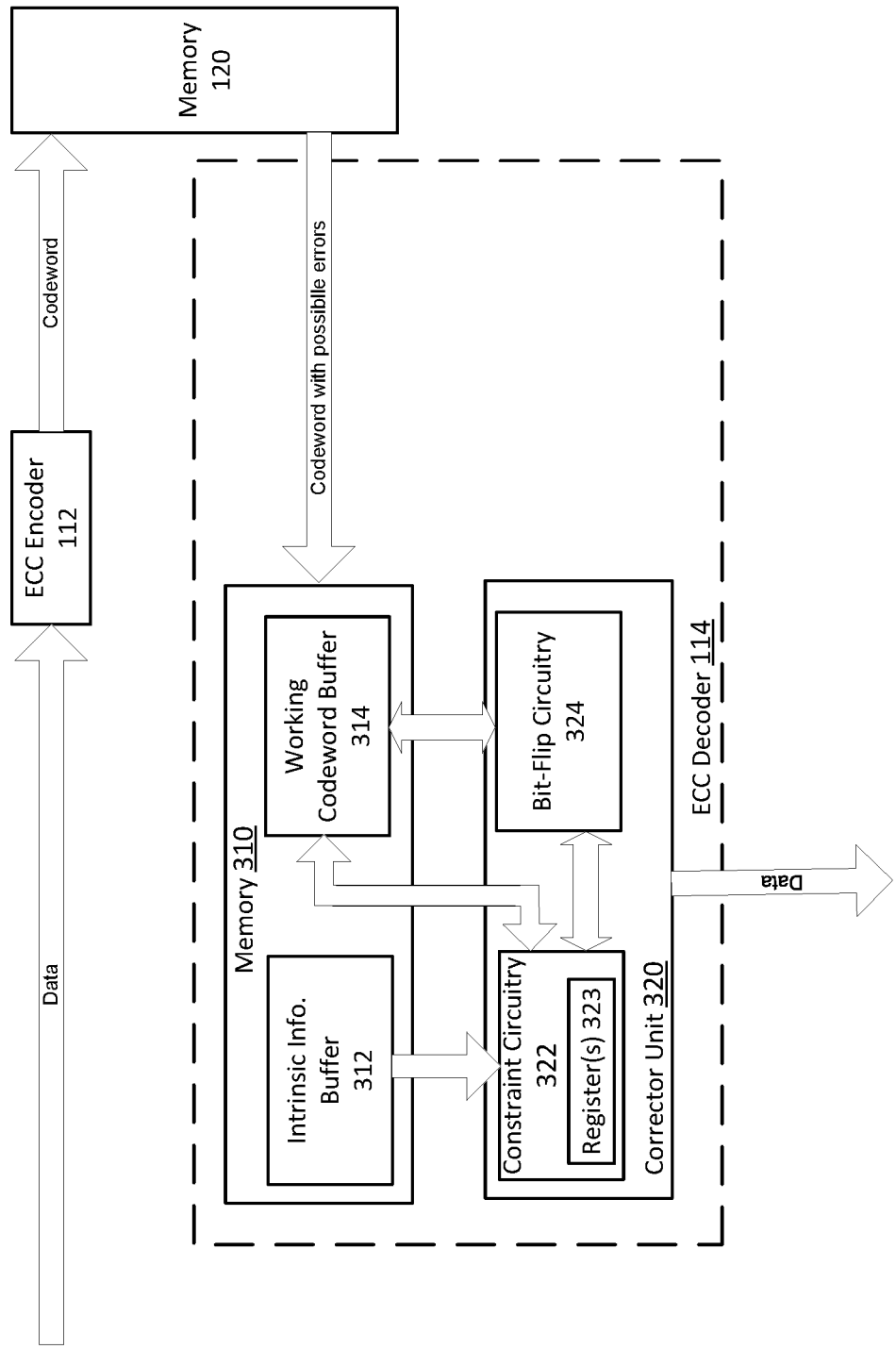
FIG. 3 illustrates an example third system.

FIG. 3 illustrates an example system 300. In some examples, as shown in FIG. 3, system 300 includes ECC encoder 112, memory 120 and ECC decoder 114. Also, ECC decoder 114 is shown as including a memory 310 and a corrector unit 320.

In some examples, data (possibly encrypted/compressed) may be encoded by ECC encoder 112 using an ECC code that may include an LDPC code. The resultant LDPC codeword may then be stored to memory 120. According to some examples, the stored LDPC codeword may be read from memory 120 and may include possible errors. As shown in FIG. 3, the codeword with possible errors may be forwarded to memory 310 of ECC decoder 114. Memory 310 may be configured to at least temporarily store the LDPC codeword in both intrinsic buffer 312 and working codeword buffer 314 while other elements of ECC decoder 114 locate errors possibly included in the LDPC codeword and attempt to correct the errors using a bit-flipping algorithm.

According to some examples, memory 310 may include volatile types of memory such as, but not limited to, SRAM. For these examples, the SRAM of memory 310 included in ECC decoder 114 may be approximately double the capacity or size of SRAM included in a typical ECC decoder arranged to implement a bit-flipping algorithm that uses SRAM to store a single, working copy of a given LDPC codeword while locating and attempting to correct errors in that single, working copy of the given LDPC codeword. The larger capacity SRAM of memory 310 may be arranged to hold double the number of bits compared to an ECC decoder that does not use intrinsic information. In other words, intrinsic buffer 312 may hold bits of a given LDPC codeword as initially read from or pulled from the channel for memory 120 and working codeword buffer 314 may hold a same or duplicate number of bits of the given LDPC codeword. However, as described more below, the initial copy of the given LDPC codeword maintained in working codeword buffer 314 may be modified by logic and/or features of corrector unit 320 while the initial copy of the given LDPC codeword maintained in intrinsic information buffer 312 is not modified or changed.

According to some examples, as described more below, logic and/or features of ECC decoder 114, such as constraint circuitry 322, may implement a bit-flipping algorithm that uses intrinsic information maintained in intrinsic information buffer 312 and in some instances weighting values indicated in register(s) 323 to cause bit-flip circuitry 324 to selectively flip bits of a working copy of an LDPC codeword stored in working codeword buffer 314 to locate and attempt to correct errors possibly included in the LDPC codeword in order to successfully decode the LDPC codeword. For these examples, although not shown in FIG. 3, bit-flip circuitry 324 may include a cluster of adders coupled with working codeword buffer 314. The cluster of adders may maintain counts for satisfied/unsatisfied check-nodes and may cause one or more bits of the working copy of the LDPC codeword to be flipped if a count of satisfied/unsatisfied check-nodes reaches a bit-flipping threshold or matches some other type of predetermined criteria. A cluster of adders does not need to couple with intrinsic information buffer 312 as the copy of the LDPC codeword maintained in intrinsic information buffer 312 does not have any bits flipped during a decoding process, as described more below.

In some examples, as shown in FIG. 3, the logic and/or features of corrector unit 320 may be configured to correct identified errors and successfully decode a given LDPC codeword based on implementing a bit-flipping algorithm and using intrinsic information. Corrector unit 320 may then forward the data for possible decompression/decryption and eventual delivery to the source of the read request.

Although FIG. 3 shows a codeword with possible errors being received from a medium such as a memory medium included in memory 120, examples are not limited to receiving an LDPC codeword from a memory medium (e.g., from a solid state drive). In alternative examples, an LDPC codeword may be received from a wireless communication medium, an optical communication medium or a medium associated with an optical reader for a 2-dimentional bar code reader.

Figure 4:
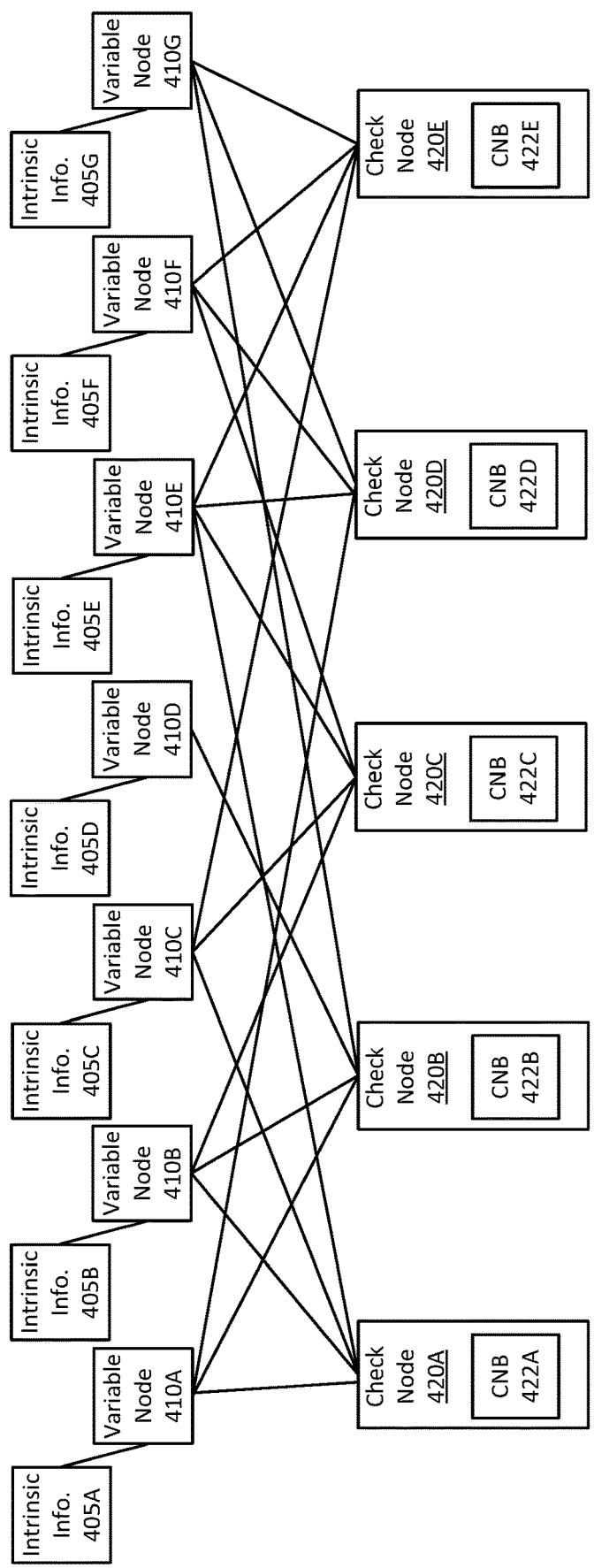
FIG. 4 illustrates an example first graph.

FIG. 4 illustrates an example graph 400. In some examples, as shown in FIG. 4, graph 400 depicts a modified version of a Tanner graph. A Tanner graph shows how LDPC codes may be represented by two kinds of nodes: variable nodes and check-nodes. For these examples, graph 400 illustrates how an LDPC codeword may be loaded into a plurality of variable nodes indicated by numbers 410A to 410G, which may be referred to collectively herein by reference numeral 410. For example, respective variable nodes 410 may represent an LDPC codeword of 7 bits that may have been obtained from memory in a read operation. Check nodes 420A to 420E, which may be referred to collectively herein by reference numeral 420 and may represent one or more parity check equations. Individual check nodes 420 may maintain check node information, which may be in the form of a check node bit (CNB) 422. Intrinsic information 405A to 405G may illustrate individual bits of the 7-bit LDPC codeword from the memory in the read operation and may be referred to collectively herein by reference numeral 405.

In operation, the codeword bits in variable nodes 410 may be subjected to one or more parity check equations or constraints associated with check nodes 420 coupled with variable nodes 410 as illustrated in graph 400 of FIG. 4. If the parity check equation or constraint associated with a check node 420 passes or is satisfied then the check node bit may be assigned a binary value of zero (0). By contrast, if the parity check equation associated with a check node 420 fails or is unsatisfied then the check node bit may be assigned a binary value of one (1).

According to some examples, an example parity check equation for decoding an LDPC codeword may include "H" as a parity check matrix of an LDPC codeword "C" with "J" rows and "n" columns. Let $h_1, h_2, \ldots, h_j$, denote the rows of H, where:

$$h_j = (h_{j,0}, h_{j,1}, \ldots, h_{j,n-1})$$

for $1 \leq j \leq J$. Then example equation (1) provides, $$s = (s_1, s_2, \ldots, s_j) = z * H^T$$

Example equation (1) gives the syndrome of the received sequence z, where the jth syndrome component $s_j$ is given by the check-sum calculated using example equation (2) that provides, $$s_j = z * h_j = \Sigma_{l=0}^{n-1} z_l h_{j,l}$$

For example equation (2), the received vector z is a decodable codeword if and only if s=0. If s≠0, errors in z are detected. A nonzero syndrome component $s_j$ indicates a parity failure or an unsatisfied constraint.

In some examples, an ECC decoder implementing a bit-flipping algorithm may use an iterative decoding scheme for the 7-bit LDPC codeword shown in graph 400. As described more below, the ECC decoder may include logic and/or features to determine whether to flip one or more bits of variable nodes 410 to satisfy the parity check equation or constraint associated with respective check nodes 420 based on comparing intrinsic information included in intrinsic information 405 to respective variable nodes 410. For example, the ECC decoder may be similar to ECC decoder 114 shown in FIG. 3 and may include a corrector unit such as corrector unit 320 having logic and/or features such as constraint circuitry 322 or bit-flip circuitry 324 to determine whether to flip one or bits of variable nodes 410 that may be maintained in a buffer of the ECC decoder such as working codeword buffer 314 based on respective intrinsic information 405 maintained in a separate buffer of the ECC decoder such as intrinsic information buffer 312.

Figure 5:
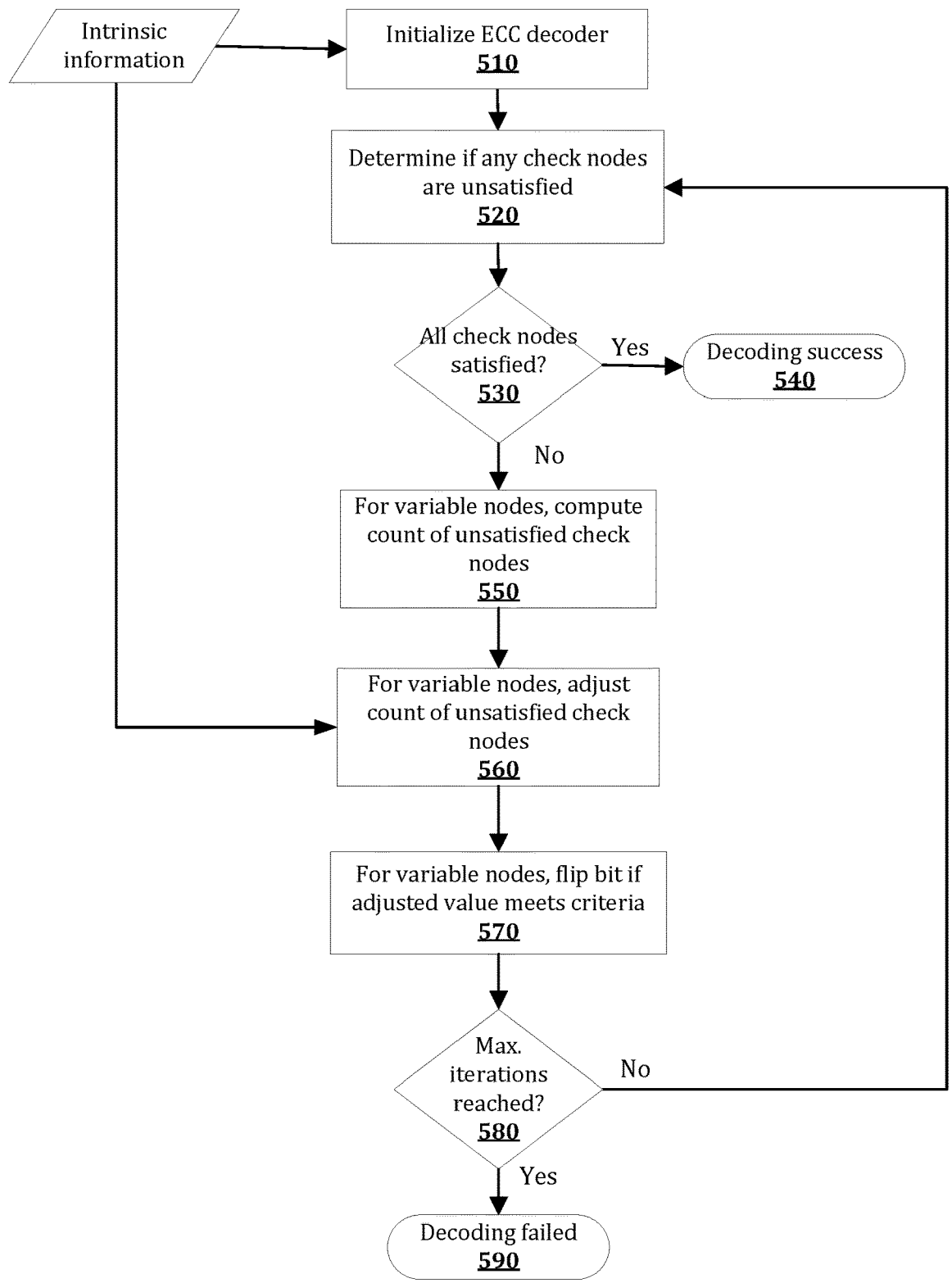
FIG. 5 illustrates an example first flow.

FIG. 5 illustrates an example flow 500. In some examples, flow 500 depicts a logic flow for decoding the 7-bit LDPC codeword represented by graph 400 shown in FIG. 4 while implementing a bit-flipping algorithm and using intrinsic information. For these examples, elements of ECC decoder 114 shown in FIG. 3 and of graph 400 shown in FIG. 4 may be used to described various portions of flow 500. Examples are not limited to elements of ECC decoder 114 or graph 400 shown FIGS. 3 and 4.

According to some examples, ECC decoder 114 may be initialized at 510 of flow 500 via receipt of a 7-bit LDPC codeword that may have been read from memory 120 responsive to a read request. A 7-bit LDPC codeword is used in this disclosure for ease of illustrating a Tanner graph with 7 variable nodes, substantially larger LDPC codewords are contemplated by this disclosure (e.g., 100-bit to as many as 10,000-bit LDPC codewords). For these examples, initialization of ECC decoder 114 may include receiving the 7-bit LDPC codeword and storing, at least temporarily, bits corresponding to the 7-bit LDPC codeword in both intrinsic information buffer 312 and working codeword buffer 314. In other words, individual bits of the 7-bit LDPC codeword corresponding to variable nodes 410 may be stored in working codeword buffer 314 and bits of the 7-bit LDPC codeword corresponding to intrinsic information 405 may be stored to intrinsic information buffer 312.

In some examples, logic and/or features of ECC decoder 114 such as constraint circuitry 322 may determine at 520 of flow 500 if any check nodes 420 are unsatisfied. As mentioned briefly above, CBs 422 of check nodes 420 having a binary value of 1 indicates that a parity check equation or constraint is unsatisfied. So, constraint circuitry 322 may check CBs 422 to determine if one or more of CBs 422 has a binary value of 1 to determine if any check nodes of check nodes 420 are unsatisfied.

According to some examples, logic and/or features of ECC decoder 114 such as constraint circuitry 322 may determine at 530 whether all check nodes 420 are satisfied. As mentioned briefly above, CBs 422 of check nodes 420 having a binary value of 0 indicates that a parity check equation or constraint has passed or is satisfied. So, constraint circuitry 322 may check CBs 422 to determine if all CBs 422 have a binary value of 0 to determine whether all check nodes 420 are satisfied. If all check nodes 420 are satisfied, then the 7-bit LDPC codeword is successfully decoded and at 540 of flow 500 a decoding success is indicated and corrector unit 320 may then forward the data encoded in the 7-bit LDPC codeword for delivery to the source of the read request.

According to some examples, if all check nodes 420 were not satisfied, then flow 500 moves to 550 where logic and/or features of ECC decoder 114 such as constraint circuitry 322 may compute a count of unsatisfied check nodes for variable nodes 410. As illustrated in graph 400 of FIG. 4, individual variable nodes 410 may couple to one or more check nodes 420. For example, variable node 410A couples with check nodes 420A, 420B and 420D. For this example, constraint circuitry 322 would compute a count of CBs for check nodes 420A, 420B and 420D that have a binary value of 1 (e.g., a count of 0, 1, 2 or 3) to compute a count of unsatisfied check nodes from variable node 410A.

In some examples, logic and/or features of ECC decoder 114 such as constraint circuitry 322 may use intrinsic information at 560 of flow 500 to adjust the count of unsatisfied check nodes 420 coupled with individual variable nodes 410. For these examples, intrinsic information maintained in intrinsic information 405 that corresponds to the individual variable nodes 410 is used to adjust the count. This adjustment may be based on the premise that most of the bits included in the 7-bit LDPC codeword initially received by ECC decoder 114 are expected to be correct. However, the bits maintained in working codeword buffer 314 may diverge from the bits maintained in the intrinsic information buffer 312 after one or more iterations of a bit-flipping algorithm are completed. Thus, constraint circuitry 322 may use binary values included in intrinsic information 405 for respective variable nodes 410 as an additional check-node to keep binary values included in variable nodes 410 mostly aligned with binary values included in intrinsic information 405. According to one example, a way to maintain this alignment is to decrement the count of unsatisfied check nodes for a variable node if the variable node's binary value matches the binary value in its corresponding intrinsic information or increment the count it the binary values do not match.

According to some examples, logic and/or features of ECC decoder 114 such as constraint circuitry 322 at 570 of flow 500 may cause bit-flit circuitry 324 to flip respective bits of variable nodes 410 if the adjusted count of unsatisfied check nodes 420 for individual variable nodes meets one or more predetermined criteria. For example, if the adjusted count indicates that more than 50% of the check nodes coupled with a variable node are unsatisfied, then the bit for that variable node is flipped (e.g., from a binary value of 1 to a binary value of 0). Examples are not limited to 50%, other criteria may include greater or lesser percentages and the criteria may also weight counts based on number of iterations or other types of observable metrics.

In some examples, logic and/or features of ECC decoder 114 such as constraint circuitry 322 at 580 of flow 500 may determine whether a maximum number of bit-flipping iterations have been reached. For these examples, a maximum number of bit-flipping iterations may be based on how many attempts to correct the 7-bit LDPC codeword can be made before deeming the 7-bit LDPC codeword as having uncorrectable errors while implementing a bit-flipping algorithm that also uses intrinsic information. The number of attempts, in some examples, may be associated with an amount of time before read latencies for reading data from a memory device becomes unacceptably high and/or a number of iterations via which a probability of correctly decoding the LDPC codeword has dropped below a threshold (e.g., below 0.25). If the maximum number of iterations has not been reached, flow 500 moves to 520.

According to some examples, logic and/or features of ECC decoder 114 such as constraint circuitry 322 at 590 of flow 500 may determine that a maximum number of iterations has been reached. For these examples, constraint circuitry 322 may indicate that decoding has failed. For these examples, an indication of decoding failure may be sent to the source of the read request.

In some examples, implementation of a bit-flipping algorithm by ECC decoder 114 using intrinsic information may also be applicable to LDPC codewords that may have punctured bits (e.g., some LDPC codeword bits that are not transmitted on a channel from memory 120 or were stored in memory 120). For these examples, variable nodes 410 for these punctured bits may be evaluated based solely on check node counts that are not adjusted based on comparing to intrinsic information.

Figure 6:
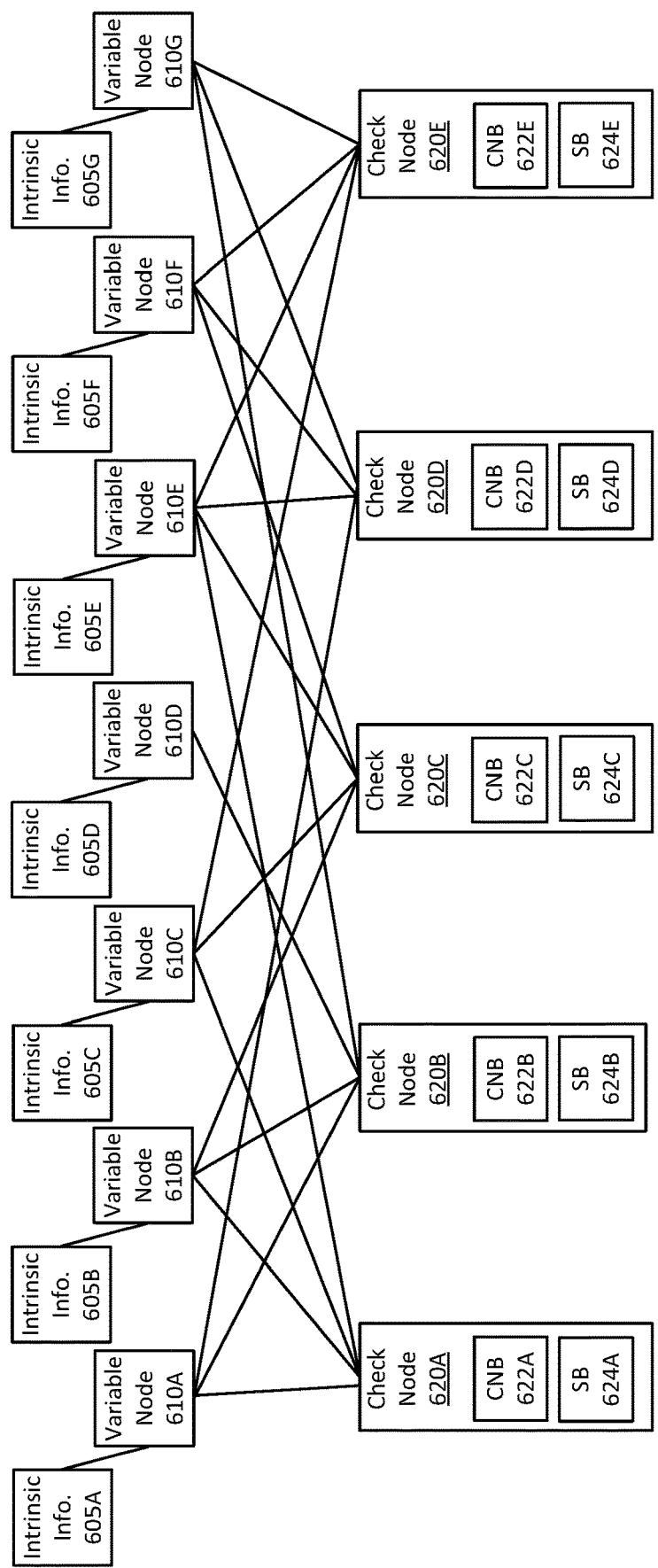
FIG. 6 illustrates example second graph.

FIG. 6 illustrates an example graph 600. In some examples, similar to graph 400 shown in FIG. 4, graph 600 shown in FIG. 6 depicts another modified version of a Tanner graph. For these examples, graph 600 illustrates how an LDPC codeword may be loaded into a plurality of variable nodes indicated by numbers 610A to 610G, which may be referred to collectively herein by reference numeral 610. For example, respective variable nodes 610 may represent an LDPC codeword of 7 bits that may have been obtained from memory in a read operation. Check nodes 620A to 620E, which may be referred to collectively herein by reference numeral 620 may represent one or more parity check equations. Individual check nodes 620 may maintain both check node information, which may be in the form of a check node bit (CNB) 622 and stability information, which may be in the form of a stability bit (SB) 324. Intrinsic information 605A to 605G may illustrate individual bits of the 7-bit LDPC codeword from the memory in the read operation and may be referred to collectively herein by reference numeral 605.

In operation, the codeword bits in variable nodes 610 may be subjected to one or more parity check equations or constraints associated with check nodes 620 coupled with variable nodes 610 as illustrated in graph 600 of FIG. 6. If the parity check equation or constraint associated with a check node 620 passes or is satisfied then the check node bit may be assigned a binary value of 0. By contrast, if the parity check equation associated with a check node 620 fails or is unsatisfied then the check node bit may be assigned a binary value of 1.

The stability information (e.g., stability bits 624) are initialized to a value that is equal to its associated CNB 622, which is used to signify a stable value and may be associated with establishing multiple levels for check nodes 620. SBs 624 may be changed from a stable value (i.e. equal to the check node bit), to an unstable value (i.e. different from the check node bit), when an LDPC codeword bit in a variable node 610 subjected to the parity check equations in a check node 620 is flipped by an ECC decoder implementing a bit-flipping algorithm, as illustrated in Table I, below.

TABLE I

| Before Flip (CNB, SB) | After Flip (CNB, SB) | Meaning |
| --- | --- | --- |
| 0, 0 | 1, 0 | Stable 0 to Unstable 1 |
| 0, 1 | 1, 0 | Unstable 0 to Unstable 1 |
| 1, 0 | 0, 1 | Unstable 1 to Unstable 0 |
| 1, 1 | 0, 1 | Stable 1 to Unstable 0 |

Thus, the maintenance of stability information in the respective check nodes 620 allows the ECC decoder to associate a stability value with CNBs 622 stored in the respective check nodes 620. For example, a CNB bit may be characterized as either a stable or unstable pass (0) or a stable or unstable fail (1), as illustrated in Table II, below.

TABLE II

| 2-Bit Value (CNB, SB) | Integer Representation | Meaning |
| --- | --- | --- |
| 0, 0 | 0 | Stable 0 |
| 0, 1 | 1 | Unstable 0 |
| 1, 0 | 2 | Unstable 1 |
| 1, 1 | 3 | Stable 1 |

Figure 7:
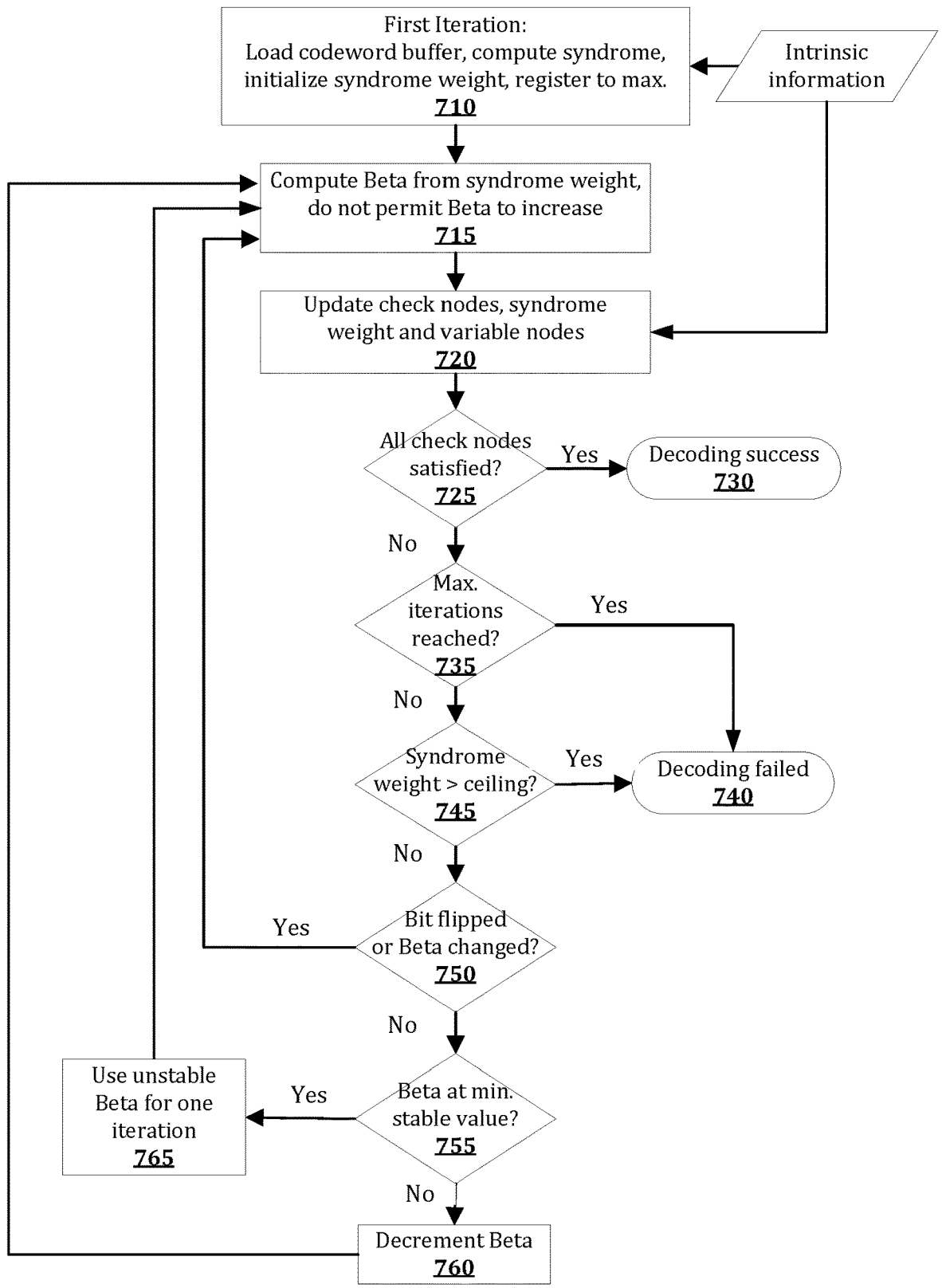
FIG. 7 illustrates an example second flow.

FIG. 7 illustrates an example flow 700. In some examples, flow 700 depicts a logic flow for decoding the 7-bit LDPC codeword represented by graph 600 shown in FIG. 6 while implementing a bit-flipping algorithm that uses intrinsic information and uses a 2-bit binary value based on CNB and SBs for check nodes 620. For these examples, elements of ECC decoder 114 shown in FIG. 3 and of graph 400 shown in FIG. 4 may be used to described various portions of flow 700. Examples are not limited to elements of ECC decoder 114 or graph 600 shown FIGS. 3 and 6.

According to some examples, at 710 of flow 700, in response to receipt of a 7-bit LDPC codeword that may have been read from memory 120 responsive to a read request, the 7-bit LDPC codeword may be loaded in both working codeword buffer 314 and intrinsic information buffer 312. In other words, individual bits of the 7-bit LDPC codeword corresponding to variable nodes 610 may be stored in working codeword buffer 314 and bits of 7-bit LDPC codeword corresponding to intrinsic information 605 may be stored in intrinsic information buffer 412. The LDPC codeword bits in variable nodes 610 are subjected to the parity check equations at each check node 620 to compute an initial syndrome, the results of which are stored in respective CNBs 622. As mentioned above, respective SBs 624 may be initialized to a stable (i.e., equal to CNBs) binary value. Further, in some examples, register(s) 323 accessible to constraint circuitry 322 may be preloaded with an initial syndrome weight which may be set to a high value.

In some examples, logic and/or features of ECC decoder 114 such as constraint circuitry 322, at 715 of flow 700 may determine a bit flipping threshold, referred to in FIG. 7 as Beta, from the syndrome weight indicated in register(s) 323. For example, Beta may be determined as an entry in a look-up table accessible to constraint circuitry 322 that may be addressed by the syndrome weight indicated in register(s) 323. Values for the entry may be chosen by running experiments with different values. An example way to choose a value of Beta is to count the number of check nodes that are coupled to a variable node (i.e. the variable node degree or variable node edges) and find the sum of the 2-bit values when half of these check nodes are stable 1 and half of these check nodes are stable 0 (see Table 11). In other words, Beta can be calculated as the variable node degree multiplied by 1.5. The rationale for this Beta calculation is that when there are more 1s than 0s, the 1s constituting a majority, the LDPC codeword bit for the variable node should be flipped. When a syndrome weight indicated in register(s) 323 is higher, it indicates that there may be a higher probability of bit errors in the LDPC codeword, and we want a larger majority before we flip an LDPC codeword bit. Therefore, higher values of Beta are chosen for higher syndrome weights. Moreover, since the sum of the 2-bit check node binary values pertaining to each variable node depends on the variable node degree, several variables of Beta, one for each value of the variable node degree, may be used in the bit-flipping algorithm for an irregular LDPC code, where variable nodes have different degrees or number of edges in a Tanner graph.

According to some examples, once the LDPC codeword is loaded into variable nodes 610, CNBs 622 and SBs 624 in the check nodes 620 are updated. For these examples, at 720 of flow 700, logic and/or features of ECC decoder 114 such as constraint circuitry 322 may update CNBs 622 and SBs 624. Then constraint circuitry 322 may update the syndrome weight indicated in register(s) 323. For these examples, constraint circuitry 322 may also use intrinsic information loaded to intrinsic information 605 (e.g., from intrinsic information buffer 312) along with a sum of 2-bit binary values for check nodes 620 coupled with variable nodes 610 to determine whether bits of variable nodes 610 are to be flipped. For example, for variable node 620A, a sum of the 2-bit binary values in check nodes 620A, 620B and 620D may be calculated and then constraint circuitry 322 may look to intrinsic information 605A to determine whether to increase or decrease this calculated sum of the 2-bit binary values. The sum may be increased or decreased based on the premise that most of the bits included in the 7-bit LDPC codeword initially received by ECC decoder 114 are expected to be correct. Under this premise, if the bit of variable node 610A matches intrinsic information 605A then the sum may be decreased in order to decrease the likelihood that the bit in variable node 610A is flipped. In some examples, adjustment amounts may vary based on how many bit-flipping iterations have been completed or other observable metrics (e.g., more iterations may result in higher adjustments). Following this adjustment, constraint circuitry 322 may cause bit-flip circuitry 324 to flip the LDPC codeword bit of variable node 610A if the adjusted sum is determined to be greater than or equal to Beta.

In some examples, check nodes 620, the syndrome weight, and variable nodes 610 may be updated on a periodic basis, e.g., every few clock cycles. An update cycle for check nodes 620, the syndrome weight, and variable nodes 610 may be shorter than a time required to complete an iteration of a bit-flipping algorithm implemented by logic and/or features of ECC decoder 114.

According to some examples, at 725 of flow 700, if constrain circuitry 322 determines that all CNBs 622 in check nodes 620 have a binary value of 0, indicating that there were no uncorrectable read errors in the LDPC codeword in variable nodes 610, then flow 700 moves to 730 and the 7-bit LDPC codeword is deemed as successfully decoded and a decoding success is indicated. Corrector unit 320 of ECC decoder 114 may then forward the data encoded in the 7-bit LDPC codeword for delivery to the source of the read request. By contrast, if at 725 it is determined that any of the CNBs at check nodes 620 are non-zero, indicating that there are one or more read errors in the LDPC codeword in variable nodes 610, then flow 700 moves to 735.

In some examples, at 735 of flow 700, logic and/or features of ECC decoder 114 such as constraint circuitry 322 may determine whether a maximum number of bit-flipping iterations have been reached. If the maximum number of iterations has not been reached, flow 700 moves to 745. Alternatively, if the maximum number of iterations was been reached, flow 700 moves to 740 and constraint circuitry 322 may indicate that decoding has failed. For this alternative, an indication of decoding failure may be sent to the source of the read request.

According to some examples, at 745 of flow 700, logic and/or features of ECC decoder 114 such as constraint circuitry 322 may determine whether the syndrome weight exceeds a ceiling. If the syndrome weight is determined to exceed a ceiling flow 700 moves to 740 and constraint circuitry 322 may indicate that decoding has failed.

In some examples, the syndrome weight ceiling may be configured using one or more registers such as register(s) 323. For these examples the syndrome weight ceiling may be static for a duration of a bit-flipping algorithm. Alternatively, the syndrome weight ceiling may be fixed to a constant number, such as 2 times the number of check nodes. By contrast, if at 745 it is determined that ECC decoder 114 has not reached a syndrome weight ceiling, then flow 700 moves to 750.

According to some examples, at 750 of flow 700, logic and/or features of ECC decoder 114 such as constraint circuitry 322 may determine whether one or more bits in variable nodes 610 were flipped or whether the value of Beta has changed in a predetermined number of clock cycles. If one or more bits were flipped of the value of Beta changed in the predetermined number of clock cycles, then flow 700 moves to 715. By contrast, if at 750 no bits were flipped and the value of Beta has not changed, then flow 700 moves 755. For example, the number of clock cycles here can be a number of clock cycles required to complete an entire iteration, i.e. updating every check node and variable node. In another example, the number of clock cycles can be arbitrarily set to 10 clock cycles. The number of clock cycles may be static for the duration of the bit-flipping algorithm.

In some examples, at 755 of flow 700, logic and/or features of ECC decoder 114 such as constraint circuitry 322 may determine that Beta has not reached a minimum stable value and flow 700 moves to operation 760 and Beta may be decremented, e.g., by one (1). Flow 700 then move to 715.

By contrast, if at 750 of flow 700, constraint circuitry 322 determines that no bits were flipped and the value of Beta has not changed, then flow 700 moves to 765. In some examples, an unstable value of Beta may be used for one iteration or until an LDPC codeword bit in variable nodes 610 is flipped. For example, an unstable Beta may be a value lower than the variable node degree multiplied by 1.5. The use of an unstable Beta allows a marginal variable node (i.e., variable nodes that are near the majority voting limit) to flip at the expense of introducing additional errors. For these examples, flow 700 moves to 715 and a new value of Beta is determined by constraint circuitry 322 from the syndrome weight from a look-up table. However, if the new value of Beta is higher than the current value of Beta, constraint circuitry 322 may maintain the current value of Beta.

Figure 8:
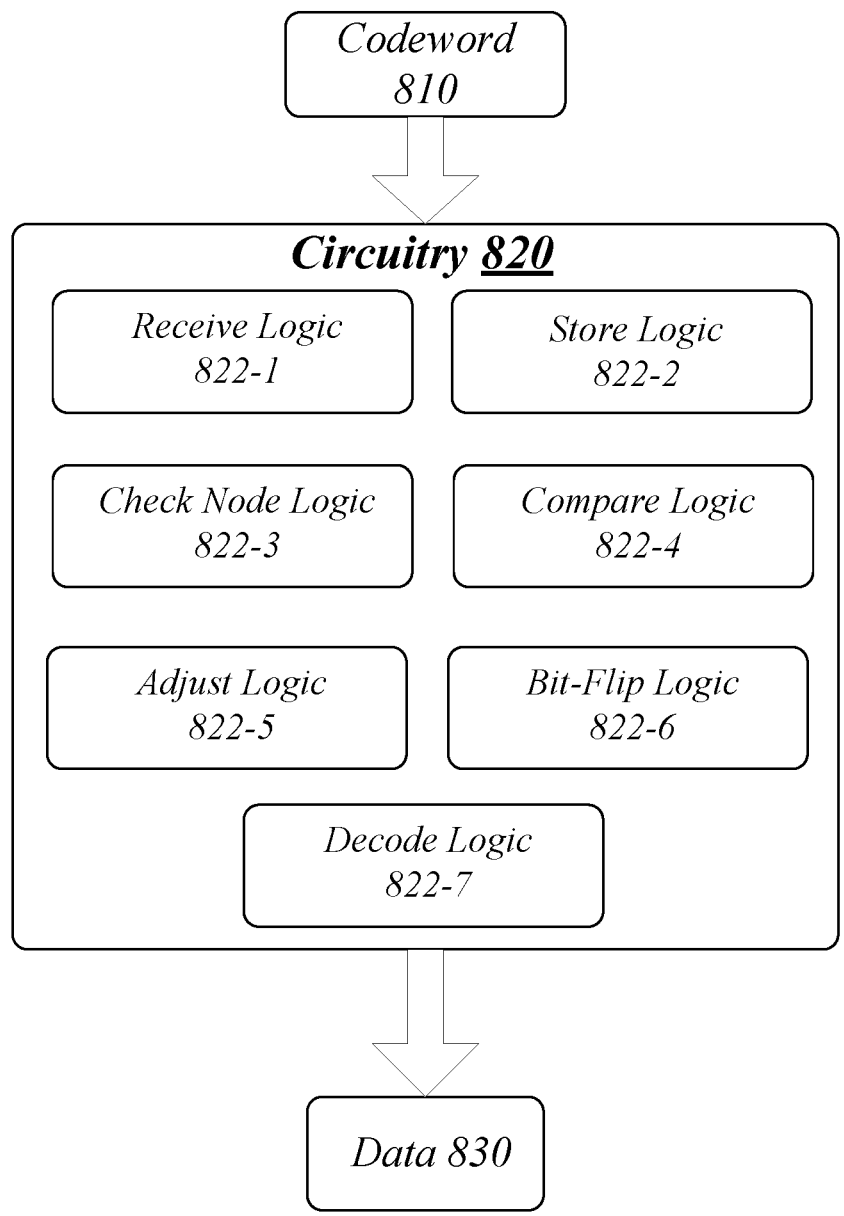
FIG. 8 illustrates an example block diagram for an apparatus.

FIG. 8 illustrates an example block diagram for an apparatus 800. Although apparatus 800 shown in FIG. 8 has a limited number of elements in a certain topology, it may be appreciated that the apparatus 800 may include more or less elements in alternate topologies as desired for a given implementation.

The apparatus 800 may be supported by circuitry 820 and, in some examples, apparatus 800 may be part of an ECC decoder included in a controller maintained at a memory device or with a memory system coupled with memory cells of the memory device through an interface that may also be used to access the memory cells (e.g., via read or write operations). The memory device may be coupled with or included in a host computing platform. Circuitry 820 may be arranged to execute one or more software or firmware implemented logic, components or modules 822-$a$ (e.g., implemented, at least in part, by circuitry of an ECC decoder and/or circuitry of a controller of a memory device). It is worthy to note that "a" and "b" and "c" and similar designators as used herein are intended to be variables representing any positive integer. Thus, for example, if an implementation sets a value for a=7, then a complete set of software or firmware for logic, components or modules 822-$a$ may include logic 822-1, 822-2, 822-3, 822-4, 822-5, 822-6 or 822-7. Also, at least a portion of "logic" may be software/firmware stored in computer-readable media, or may be implemented, at least in part in hardware and although the logic is shown in FIG. 8 as discrete boxes, this does not limit logic to storage in distinct computer-readable media components (e.g., a separate memory, etc.) or implementation by distinct hardware components (e.g., separate application-specific integrated circuits (ASICs) or field programmable gate arrays (FPGAs) included in an ECC decoder and/or controller).

According to some examples, circuitry 820 may include a processor or processor circuitry. The processor or processor circuitry can be any of various commercially available processors, including without limitation an AMD® Athlon®, Duron® and Opteron® processors. ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors, and similar processors. According to some examples circuitry 820 may also include one or more ASICs or FPGAs and, in some examples, at least some logic 822-$a$ may be implemented as hardware elements of these ASICs or FPGAs.

According to some examples, apparatus 800 may include a receive logic 822-1. Receive logic 822-1 may be a logic and/or feature executed by circuitry 820 to receive an LDPC codeword. For these examples, the LDPC codeword may be included in codeword 810 from a memory coupled with a controller. The controller may have an ECC decoder that may include apparatus 800.

In some examples, apparatus 800 may also include a store logic 822-2. Store logic 822-2 may be a logic and/or feature executed by circuitry 820 to store bits of the LDPC codeword in a first buffer for use of each bit of the LDPC codeword as a separate variable node for implementing a bit-flipping algorithm. Store logic 822-2 may also store information that includes the bits of the LDPC codeword in a second buffer. For these examples, the first and second buffers may also be part of and/or maintained within the ECC decoder.

According to some examples, apparatus 800 may also include a check node logic 822-3. Check node logic 822-3 may be a logic and/or feature executed by circuitry 820 to determine whether one or more check nodes coupled with the separate variable nodes are unsatisfied based on separate parity check equations for the one or more check nodes calculated during an iteration of the bit-flipping algorithm.

In some examples, apparatus 800 may also include a compare logic 822-4. Compare logic 822-4 may be a logic and/or feature executed by circuitry 820 to compare the bits of the LDPC codeword stored in the second buffer to bits for the separate variable nodes.

According to some examples, apparatus 800) may also include an adjust logic 822-5. Adjust logic 822-5 may be a logic and/or feature executed by circuitry 820 to adjust a value associated with one or more criteria for flipping a bit included in individual bits of the separate variable nodes based on whether the bit matches a respective binary value for a corresponding bit of the LDPC codeword stored in the second buffer. In some examples, the value may be based, at least in part, on a count of unsatisfied check nodes coupled with respective variable nodes. The value may also be based, at least in part, on a sum of 2-bit binary values for check nodes coupled with respective variable, the first bit of a 2-bit binary value for each of the one or more check nodes indicates whether a check node passed a parity check equation during the iteration of the bit-flipping algorithm and a second bit of the 2-bit binary value indicates whether the variable node had been flipped in a previous iteration of the bit-flipping algorithm.

In some examples, apparatus 800 may also include a bit-flip logic 822-6. Bit-flip logic 822-6 may be a logic and/or feature executed by circuitry 820 to cause the bit to flip based on the adjusted value. The bit may be caused to flip, in some examples, based on the adjusted value exceeding a bit-flipping threshold value.

According to some examples, apparatus 800 may also include a decode logic 822-7. Decode logic 822-7 may be a logic and/or feature executed by circuitry 820 to decode the LDPC codeword with the flipped bit based on all check nodes coupled with the separate variable nodes being satisfied following the flipping of the bit. For these examples, the decoded LDPC codeword may be included in data 830. Data 830 may be sent to a source of a request to read the data from the memory from which the LDPC codeword was received by receive logic 822-1.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 9 illustrates an example of a logic flow 900. Logic flow 900 may be representative of some or all of the operations executed by one or more logic, features, or devices described herein, such as apparatus 800. More particularly, logic flow 900 may be implemented by one or more of receive logic 822-1, store logic 822-2, check node logic 822-3, compare logic 822-4, adjust logic 822-5, bit-flip logic 822-6 or decode logic 822-7.

According to some examples, logic flow 900 at block 902 may receive an LDPC codeword y. For these examples, receive logic 822-1 may receive the LDPC codeword.

In some examples, logic flow 900 at block 904 may store bits of the LDPC codeword in a first buffer of a bit-flipping ECC decoder for use of each bit of the LDPC codeword as a separate variable node by the bit-flipping ECC decoder. For these examples, stored logic 822-2 may store the bits in the first buffer.

According to some examples, logic flow 900 at block 906 may store information that includes the bits of the LDPC codeword in a second buffer of the bit-flipping ECC decoder. For these examples, store logic 822-2 may store the information to the second buffer.

In some examples, logic flow 900 at block 908 may determine whether one or more check nodes coupled with the separate variable nodes are unsatisfied based on separate parity check equations for the one or more check nodes calculated during an iteration of a bit-flipping algorithm. For these examples, check node logic 822-3 may make the determination.

According to some examples, logic flow 900 at block 910 may compare the bits of the LDPC codeword stored in the second buffer to bits for the separate variable nodes. For these examples, compare logic 822-4 may make the comparison.

In some examples, logic flow 900 at block 912 may adjust a value associated with one or more criteria for flipping a bit included in individual bits of the separate variable nodes based on whether the bit matches a respective binary value for a corresponding bit of the LDPC codeword stored in the second buffer. For these examples, adjust logic 822-5 may adjust the value.

According to some examples, logic flow 900 at block 914 may cause the bit to flip based on the adjusted value. For these examples, bit-flip logic 822-6 may cause the bit to flip.

In some examples, logic flow 900 at block 916 may decode the LDPC codeword with the flipped bit based on all check nodes coupled with the separate variable nodes being satisfied following the flipping of the bit. For these examples, decode logic 822-7 may decode the LDPC codeword.

FIG. 10 illustrates an example of a first storage medium. As shown in FIG. 10, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 11:
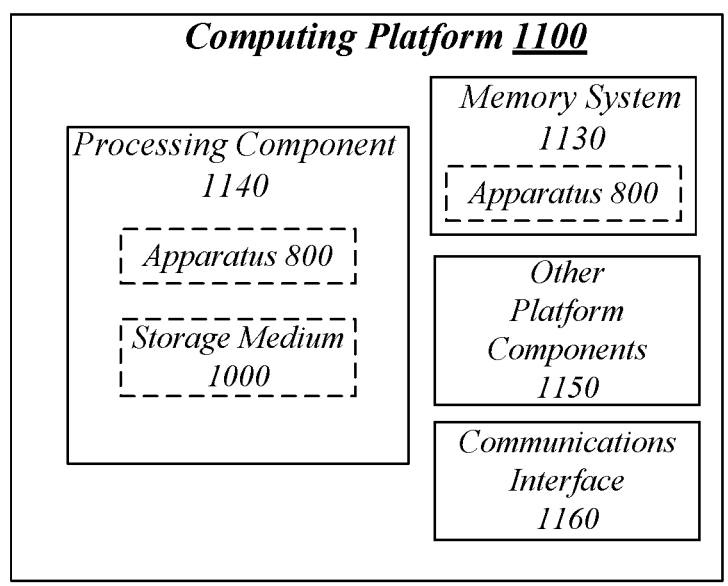
FIG. 11 illustrates an example computing platform.

FIG. 11 illustrates an example computing platform 1100. In some examples, as shown in FIG. 11, computing platform 1100 may include a memory system 1130, a processing component 1140, other platform components 1150 or a communications interface 1160. According to some examples, computing platform 1100 may be implemented in a computing device.

According to some examples, memory system 1130 may include a controller and one or more memory devices. For these examples, logic and/or features resident at or located at controller may execute at least some processing operations or logic for apparatus 800. Also, the one or more memory devices may include similar types of non-volatile memory (not shown) that are described above for systems 100, 200 or 300 shown in FIGS. 1-3. In some examples, the controller may be part of a same die with the one or more memory devices. In other examples, the controller and one or more memory devices may be located on a same die or integrated circuit with a processor (e.g., included in processing component 1140). In yet other examples, the controller may be in a separate die or integrated circuit coupled with the one or more memory device.

According to some examples, processing component 1140 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1150 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1150 or storage system 1130 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1160 may include logic and/or features to support a communication interface. For these examples, communications interface 1160 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (hereinafter "IEEE 802.3").

Computing platform 1100 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1100 described herein, may be included or omitted in various embodiments of computing platform 1100, as suitably desired.

The components and features of computing platform 1100 may be implemented using any combination of discrete circuitry, ASICs, logic gates and/or single chip architectures. Further, the features of computing platform 1100 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The following examples pertain to additional examples of technologies disclosed herein

Example 1

An example ECC decoder may include a first buffer and a second buffer. The ECC decoder may also include circuitry to receive an LDPC codeword. The circuitry may also store bits of the LDPC codeword in the first buffer for use of each bit of the LDPC codeword as a separate variable node for implementing a bit-flipping algorithm. The circuitry may also store information that includes the bits of the LDPC codeword in the second buffer. The circuitry may also determine whether one or more check nodes coupled with the separate variable nodes are unsatisfied based on separate parity check equations for the one or more check nodes calculated during an iteration of the bit-flipping algorithm. The circuitry may also compare the bits of the LDPC codeword stored in the second buffer to bits for the separate variable nodes. The circuitry may also adjust a value associated with one or more criteria for flipping a bit included in individual bits of the separate variable nodes based on whether the bit matches a respective binary value for a corresponding bit of the LDPC codeword stored in the second buffer. The circuitry may also cause the bit to flip based on the adjusted value. The circuitry may also decode the LDPC codeword with the flipped bit based on all check nodes coupled with the separate variable nodes being satisfied following the flipping of the bit.

Example 2

The ECC decoder of example 1, the circuitry to cause the bit to flip based on the adjusted value may include the circuitry to cause the bit to be flipped based on the adjusted value exceeding a bit-flipping threshold value.

Example 3

The ECC decoder of example 2 may also include the value associated with one or more criteria is a count of unsatisfied check nodes coupled with a variable node having the bit that was flipped. For this example, the bit-flipping threshold is 50 percent of check nodes coupled with the variable node are determined to be counted as unsatisfied check nodes.

Example 4

The ECC decoder of example 3, the circuitry may also increment the count of unsatisfied check nodes based on the bit not matching the respective binary value for the corresponding bit of the LDPC codeword stored in the second buffer in order to adjust the value associated with one or more criteria for flipping the bit.

Example 5

The ECC decoder of example 2 may also include the value associated with one or more criteria is based a sum of 2-bit binary values for one or more check nodes coupled with a variable node having the bit that was flipped. For these examples, a first bit of a 2-bit binary value for each of the one or more check nodes may indicate whether a check node passed a parity check equation during the iteration of the bit-flipping algorithm. Also, a second bit of the 2-bit binary value may indicate whether the variable node had been flipped in a previous iteration of the bit-flipping algorithm.

Example 6

The ECC decoder of example 5, the circuitry may also increase the sum of 2-bit binary values based on the bit not matching the respective binary value for the corresponding bit of the LDPC codeword stored in the second buffer in order to adjust the value associated with the one or more criteria for flipping the bit.

Example 7

The ECC decoder of example 1 may also include the circuitry to receive the LDPC codeword from a memory including volatile or non-volatile memory.

Example 8

The ECC decoder of example 7, the volatile memory may include RAM, DRAM, DDR SDRAM, SRAM, T-RAM or Z-RAM.

Example 9

The ECC decoder of example 8, the non-volatile memory may include phase change memory that uses chalcogenide phase change material, flash memory, single or multi-level PCM, nanowire memory, FeTRAM, anti-ferroelectric memory, CB-RAM, a spintronic magnetic junction memory, MTJ memory, a domain wall (DW) and spin orbit transfer (SOT) memory, a thiristor based memory, MRAM that incorporates memristor technology, or STT-MRAM.

Example 10

The ECC decoder of example 1, the circuitry to receive the LDPC codeword from a memory medium, a wireless communication medium or an optical communication medium.

Example 11

An example method may include receiving an LDPC codeword and storing bits of the LDPC codeword in a first buffer of a bit-flipping ECC decoder for use of each bit of the LDPC codeword as a separate variable node by the bit-flipping ECC decoder. The method may also include storing information that includes the bits of the LDPC codeword in a second buffer of the bit-flipping ECC decoder. The method may also include determining whether one or more check nodes coupled with the separate variable nodes are unsatisfied based on separate parity check equations for the one or more check nodes calculated during an iteration of a bit-flipping algorithm. The method may also include comparing the bits of the LDPC codeword stored in the second buffer to bits for the separate variable nodes. The method may also include adjusting a value associated with one or more criteria for flipping a bit included in individual bits of the separate variable nodes based on whether the bit matches a respective binary value for a corresponding bit of the LDPC codeword stored in the second buffer. The method may also include causing the bit to flip based on the adjusted value. The method may also include decoding the LDPC codeword with the flipped bit based on all check nodes coupled with the separate variable nodes being satisfied following the flipping of the bit.

Example 12

The method of example 11 may also include causing the bit to flip based on the adjusted value comprises causing the bit to be flipped based on the adjusted value exceeding a bit-flipping threshold value.

Example 13

The method of example 12 may also include the value associated with one or more criteria is a count of unsatisfied check nodes coupled with a variable node having the bit that was flipped. For this example, the bit-flipping threshold is 50 percent of check nodes coupled with the variable node are determined to be counted as unsatisfied check nodes.

Example 14

The method of example 13 may also include incrementing the count of unsatisfied check nodes based on the bit not matching the respective binary value for the corresponding bit of the LDPC codeword stored in the second buffer in order to adjust the value associated with one or more criteria for flipping the bit.

Example 15

The method of example 13 may also include the value associated with one or more criteria being based a sum of 2-bit binary values for one or more check nodes coupled with a variable node having the bit that was flipped. For this example, a first bit of a 2-bit binary value for each of the one or more check nodes indicates whether a check node passed a parity check equation during the iteration of the bit-flipping algorithm. Also, a second bit of the 2-bit binary value may indicate whether the variable node had been flipped in a previous iteration of the bit-flipping algorithm.

Example 16

The method of example 15 may also include increasing the sum of 2-bit binary values based on the bit not matching the respective binary value for the corresponding bit of the LDPC codeword stored in the second buffer in order to adjust the value associated with the one or more criteria for flipping the bit.

Example 17

The method of example 11 may also include receiving the LDPC codeword from a memory including volatile or non-volatile memory.

Example 18

The method of example 17, the volatile memory may include RAM, DRAM, DDR SDRAM, SRAM, T-RAM or Z-RAM.

Example 19

The method of example 18, the non-volatile memory may include phase change memory that uses chalcogenide phase change material, flash memory, single or multi-level PCM, nanowire memory, FeTRAM, anti-ferroelectric memory, CB-RAM, a spintronic magnetic junction memory, MTJ memory, a domain wall (DW) and spin orbit transfer (SOT) memory, a thiristor based memory, MRAM that incorporates memristor technology, or STT-MRAM.

Example 20

The method of example 11 may also include receiving the LDPC codeword from a memory medium, a wireless communication medium or an optical communication medium.

Example 21

An example at least one machine readable medium may include a plurality of instructions that in response to being executed by a system cause the system to carry out a method according to any one of examples 11 to 20.

Example 22

An example apparatus may include means for performing the methods of any one of examples 11 to 20.

Example 23

An example apparatus may include at least one memory device. The apparatus may also include a controller that includes an ECC decoder. The ECC decoder may include a first buffer, a second buffer and circuitry. The circuitry may receive an LDPC codeword from the at least one memory device. The circuitry may also store bits of the LDPC codeword in the first buffer for use of each bit of the LDPC codeword as a separate variable node for implementing a bit-flipping algorithm. The circuitry may also store information that includes the bits of the LDPC codeword in the second buffer. The circuitry may also determine whether one or more check nodes coupled with the separate variable nodes are unsatisfied based on separate parity check equations for the one or more check nodes calculated during an iteration of the bit-flipping algorithm. The circuitry may also compare the bits of the LDPC codeword stored in the second buffer to bits for the separate variable nodes. The circuitry may also adjust a value associated with one or more criteria for flipping a bit included in individual bits of the separate variable nodes based on whether the bit matches a respective binary value for a corresponding bit of the LDPC codeword stored in the second buffer. The circuitry may also cause the bit to flip based on the adjusted value. The circuitry may also decode the LDPC codeword with the flipped bit based on all check nodes coupled with the separate variable nodes being satisfied following the flipping of the bit.

Example 24

The apparatus of example 23, the circuitry to cause the bit to flip based on the adjusted value may include the circuitry to cause the bit to be flipped based on the adjusted value exceeding a bit-flipping threshold value.

Example 25

The apparatus of example 24 may include the value associated with one or more criteria is a count of unsatisfied check nodes coupled with a variable node having the bit that was flipped. For this example, the bit-flipping threshold may be 50 percent of check nodes coupled with the variable node are determined to be counted as unsatisfied check nodes.

Example 26

The apparatus of example 25, the circuitry may also increment the count of unsatisfied check nodes based on the bit not matching the respective binary value for the corresponding bit of the LDPC codeword stored in the second buffer in order to adjust the value associated with one or more criteria for flipping the bit.

Example 27

The apparatus of example 24, the value associated with one or more criteria may be based a sum of 2-bit binary values for one or more check nodes coupled with a variable node having the bit that was flipped. For this example, a first bit of a 2-bit binary value for each of the one or more check nodes indicates whether a check node passed a parity check equation during the iteration of the bit-flipping algorithm. Also, a second bit of the 2-bit binary value indicates whether the variable node had been flipped in a previous iteration of the bit-flipping algorithm.

Example 28

The apparatus of example 27, the circuitry may also increase the sum of 2-bit binary values based on the bit not matching the respective binary value for the corresponding bit of the LDPC codeword stored in the second buffer in order to adjust the value associated with the one or more criteria for flipping the bit.

Example 29

The apparatus of example 23, the memory may include volatile or non-volatile memory.

Example 30

The apparatus of example 29, the volatile memory may include RAM, DRAM, DDR SDRAM, SRAM, T-RAM or Z-RAM.

Example 31

The apparatus of example 30, the non-volatile memory may include phase change memory that uses chalcogenide phase change material, flash memory, single or multi-level PCM, nanowire memory, FeTRAM, anti-ferroelectric memory, CB-RAM, a spintronic magnetic junction memory, MTJ memory, a domain wall (DW) and spin orbit transfer (SOT) memory, a thiristor based memory, MRAM that incorporates memristor technology, or STT-MRAM.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An error correction control (ECC) decoder comprising:
    a first buffer;
    a second buffer; and
    circuitry to:
        receive a low density parity check (LDPC) codeword;
        store bits of the LDPC codeword in the first buffer for use of each bit of the LDPC codeword as a separate variable node for implementing a bit-flipping algorithm;
        store information that includes the bits of the LDPC codeword in the second buffer;
        determine whether one or more check nodes coupled with the separate variable nodes according to a Tanner graph are unsatisfied based on separate parity check equations for the one or more check nodes calculated during an iteration of the bit-flipping algorithm;
        compare the bits of the LDPC codeword stored in the second buffer to bits for the separate variable nodes;
        adjust a value associated with one or more criteria for flipping a bit included in individual bits of the separate variable nodes based on whether the bit matches a respective binary value for a corresponding bit of the LDPC codeword stored in the second buffer;
        cause the bit to flip based on the adjusted value equaling or exceeding a bit-flipping threshold value; and
        decode the LDPC codeword with the flipped bit based on all check nodes coupled with the separate variable nodes being satisfied following the flipping of the bit.

2. The ECC decoder of claim 1, further comprising:
    the value associated with one or more criteria is a count of unsatisfied check nodes coupled with a variable node having the bit that was flipped; and
    the bit-flipping threshold value is 50 percent of check nodes coupled with the variable node are determined to be counted as unsatisfied check nodes.

3. The ECC decoder of claim 2, further comprising the circuitry to:
    increment the count of unsatisfied check nodes based on the bit not matching the respective binary value for the corresponding bit of the LDPC codeword stored in the second buffer in order to adjust the value associated with one or more criteria for flipping the bit; and
    cause the bit to flip based on the count of unsatisfied check nodes exceeding 50 percent of check nodes coupled with the variable node.

4. The ECC decoder of claim 1, further comprising:
    the value associated with one or more criteria is based on a sum of 2-bit binary values for one or more check nodes coupled with a variable node having the bit that was flipped, wherein;
        a first bit of a 2-bit binary value for each of the one or more check nodes indicates whether a check node passed a parity check equation during the iteration of the bit-flipping algorithm; and
        a second bit of the 2-bit binary value indicates whether the variable node had been flipped in a previous iteration of the bit-flipping algorithm.

5. The ECC decoder of claim 4, further comprising the circuitry to:
    increase the sum of 2-bit binary values based on the bit not matching the respective binary value for the corresponding bit of the LDPC codeword stored in the second buffer in order to adjust the value associated with the one or more criteria for flipping the bit; and
    the bit-flipping threshold value is based on a syndrome ceiling value, wherein the circuitry is to cause the bit to flip based on the sum of 2-bit binary values exceeding the syndrome ceiling value.

6. The ECC decoder of claim 1, comprising receiving the LDPC codeword from a memory including volatile or non-volatile memory.

7. The ECC decoder of claim 6, the volatile memory comprising random-access memory (RAM), Dynamic RAM (DRAM), double data rate synchronous dynamic RAM (DDR SDRAM), static random-access memory (SRAM), thyristor RAM (T-RAM) or zero-capacitor RAM (Z-RAM).

8. The ECC decoder of claim 7, the non-volatile memory comprising phase change memory that uses chalcogenide phase change material, flash memory, single or multi-level phase change memory (PCM), nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, or spin transfer torque MRAM (STT-MRAM).

9. The ECC decoder of claim 1, comprising the circuitry to receive the LDPC codeword from a memory medium, a wireless communication medium or an optical communication medium.

10. A method comprising:
    receiving a low density parity check (LDPC) codeword;
    storing bits of the LDPC codeword in a first buffer of a bit-flipping error correction control (ECC) decoder for use of each bit of the LDPC codeword as a separate variable node by the bit-flipping ECC decoder;
    storing information that includes the bits of the LDPC codeword in a second buffer of the bit-flipping ECC decoder;
    determining whether one or more check nodes coupled with the separate variable nodes according to a Tanner graph are unsatisfied based on separate parity check equations for the one or more check nodes calculated during an iteration of a bit-flipping algorithm;
comparing the bits of the LDPC codeword stored in the second buffer to bits for the separate variable nodes;
adjusting a value associated with one or more criteria for flipping a bit included in individual bits of the separate variable nodes based on whether the bit matches a respective binary value for a corresponding bit of the LDPC codeword stored in the second buffer;
causing the bit to flip based on the adjusted value equaling or exceeding a bit-flipping threshold value; and
decoding the LDPC codeword with the flipped bit based on all check nodes coupled with the separate variable nodes being satisfied following the flipping of the bit.

11. The method of claim 10, further comprising;
the value associated with one or more criteria is a count of unsatisfied check nodes coupled with a variable node having the bit that was flipped; and
the bit-flipping threshold value is 50 percent of check nodes coupled with the variable node are determined to be counted as unsatisfied check nodes.

12. The method of claim 11, further comprising:
incrementing the count of unsatisfied check nodes based on the bit not matching the respective binary value for the corresponding bit of the LDPC codeword stored in the second buffer in order to adjust the value associated with one or more criteria for flipping the bit; and
causing the bit to flip based on the count of unsatisfied check nodes exceeding 50 percent of check nodes coupled with the variable node.

13. The method of claim 11, further comprising:
the value associated with one or more criteria is based on a sum of 2-bit binary values for one or more check nodes coupled with a variable node having the bit that was flipped, wherein;
  a first bit of a 2-bit binary value for each of the one or more check nodes indicates whether a check node passed a parity check equation during the iteration of the bit-flipping algorithm; and
  a second bit of the 2-bit binary value indicates whether the variable node had been flipped in a previous iteration of the bit-flipping algorithm.

14. The method of claim 13, further comprising:
the bit-flipping threshold value is based on a syndrome ceiling value,
increasing the sum of 2-bit binary values based on the bit not matching the respective binary value for the corresponding bit of the LDPC codeword stored in the second buffer in order to adjust the value associated with the one or more criteria for flipping the bit; and
causing the bit to flip based on the sum of 2-bit binary values exceeding the syndrome ceiling value.

15. The method of claim 10, comprising receiving the LDPC codeword from a memory medium, a wireless communication medium or an optical communication medium.

16. An apparatus comprising:
at least one memory device; and
a controller that includes an error correction control (ECC) decoder, the ECC decoder to include:
  a first buffer;
  a second buffer; and
  circuitry to:
    receive a low density parity check (LDPC) codeword from the at least one memory device;
    store bits of the LDPC codeword in the first buffer for use of each bit of the LDPC codeword as a separate variable node for implementing a bit-flipping algorithm;
    store information that includes the bits of the LDPC codeword in the second buffer;
    determine whether one or more check nodes coupled with the separate variable nodes according to a Tanner graph are unsatisfied based on separate parity check equations for the one or more check nodes calculated during an iteration of the bit-flipping algorithm;
    compare the bits of the LDPC codeword stored in the second buffer to bits for the separate variable nodes;
    adjust a value associated with one or more criteria for flipping a bit included in individual bits of the separate variable nodes based on whether the bit matches a respective binary value for a corresponding bit of the LDPC codeword stored in the second buffer;
    cause the bit to flip based on the adjusted value equaling or exceeding a bit-flipping threshold value; and
    decode the LDPC codeword with the flipped bit based on all check nodes coupled with the separate variable nodes being satisfied following the flipping of the bit.

17. The apparatus of claim 16, further comprising;
the value associated with one or more criteria is a count of unsatisfied check nodes coupled with a variable node having the bit that was flipped; and
the bit-flipping threshold value is 50 percent of check nodes coupled with the variable node are determined to be counted as unsatisfied check nodes.

18. The apparatus of claim 17, further comprising the circuitry to:
increment the count of unsatisfied check nodes based on the bit not matching the respective binary value for the corresponding bit of the LDPC codeword stored in the second buffer in order to adjust the value associated with one or more criteria for flipping the bit; and
cause the bit to flip based on the count of unsatisfied check nodes exceeding 50 percent of check nodes coupled with the variable node.

19. The apparatus of claim 16, further comprising:
the value associated with one or more criteria is based on a sum of 2-bit binary values for one or more check nodes coupled with a variable node having the bit that was flipped, wherein;
  a first bit of a 2-bit binary value for each of the one or more check nodes indicates whether a check node passed a parity check equation during the iteration of the bit-flipping algorithm; and
  a second bit of the 2-bit binary value indicates whether the variable node had been flipped in a previous iteration of the bit-flipping algorithm.

20. The apparatus of claim 19, further comprising the circuitry to:
increase the sum of 2-bit binary values based on the bit not matching the respective binary value for the corresponding bit of the LDPC codeword stored in the second buffer in order to adjust the value associated with the one or more criteria for flipping the bit; and the bit-flipping threshold is based on a syndrome ceiling value, wherein the circuitry is to cause the bit to flip based on the sum of 2-bit binary values exceeding the syndrome ceiling value.

* * * * *